United States Patent
Miyachi et al.

[11] Patent Number: 6,069,931
[45] Date of Patent: May 30, 2000

[54] MASK STRUCTURE AND MASK HOLDING MECHANISM FOR EXPOSURE APPARATUS

[75] Inventors: Takeshi Miyachi, Utsunomiya; Shinichi Hara, Kitakawabemachi, both of Japan

[73] Assignee: Canon Kabushiki Kaisha, Tokyo, Japan

[21] Appl. No.: 09/030,081

[22] Filed: Feb. 25, 1998

[30] Foreign Application Priority Data

Feb. 28, 1997 [JP] Japan ................................. 9-045665
Feb. 28, 1997 [JP] Japan ................................. 9-045668

[51] Int. Cl.⁷ ..................................................... H01L 21/30
[52] U.S. Cl. ................................. 378/34; 378/35; 216/12; 430/5
[58] Field of Search ................................. 378/34, 35, 205; 216/12; 430/5

[56] References Cited

U.S. PATENT DOCUMENTS

| | | | |
|---|---|---|---|
| 3,569,718 | 3/1971 | Borner | 250/201 |
| 4,592,081 | 5/1986 | Eaton et al. | 378/34 |
| 5,117,255 | 5/1992 | Shiraishi et al. | 355/53 |
| 5,184,176 | 2/1993 | Unno et al. | 355/52 |
| 5,333,167 | 7/1994 | Iizuka et al. | 378/35 |
| 5,444,753 | 8/1995 | Hayashida et al. | 378/35 |
| 5,504,793 | 4/1996 | Chen | 378/34 |
| 5,544,213 | 8/1996 | Chiba et al. | 378/34 |
| 5,585,923 | 12/1996 | Nose et al. | 356/363 |
| 5,593,800 | 1/1997 | Fujioka et al. | 378/35 |
| 5,600,698 | 2/1997 | Terashima et al. | 378/34 |
| 5,608,773 | 3/1997 | Korenaga et al. | 378/34 |
| 5,854,819 | 12/1998 | Hara et al. | 378/34 |

FOREIGN PATENT DOCUMENTS 60-182441 9/1985 Japan.

*Primary Examiner*—David P. Porta
*Assistant Examiner*—Drew A. Dunn
*Attorney, Agent, or Firm*—Fitzpatrick, Cella, Harper & Scinto

[57] ABSTRACT

A mask holding system includes a chucking mechanism for holding a mask structure including a frame and a mask substrate having a rectangular window with a mask pattern, and a load mechanism for applying, at a position along an extension of a diagonal of the rectangular window, a load to the frame in a direction along the plane of the mask, whereby the mask pattern can be distorted isotropically with the application of the load along the mask plane.

20 Claims, 19 Drawing Sheets

MASK STRUCTURE AND MASK HOLDING MECHANISM FOR EXPOSURE APPARATUS

FIELD OF THE INVENTION AND RELATED ART

This invention relates to a mask structure and a mask holding mechanism for an exposure apparatus which uses a radiation beam such as X-rays, vacuum ultraviolet rays or an electron beam, for example. In another aspect, the invention is concerned with correction of a pattern of such a mask.

For enlarged integration of a semiconductor device such as an LSI and for improvement of operation speed of the device, a circuit pattern has been miniaturized more and more. For formation of a circuit pattern in the processes of manufacture of an LSI, a lithographic technology for forming a fine pattern by use of a radiation beam such as X-rays, vacuum ultraviolet rays or an electron beam, for example, has been attractive. One effective method based on this technology is unit-magnification exposure wherein a mask and a wafer are disposed in proximity to each other and wherein pattern transfer is performed by projection of a radiation beam. Examples are disclosed in U.S. Pat. Nos. 5,444,753, 5,544,213 and 5,608,773.

In this method, a mask and a wafer are disposed in proximity to each other and unit-magnification transfer is performed. It is, therefore, difficult to adjust the transfer magnification of a mask pattern to be transferred to a wafer. As a solution therefor, in an X-ray exposure apparatus disclosed in Japanese Laid-Open Patent Application, Laid-Open No. 182441/1985, a force is externally applied to a mask substrate by use of a pressing mechanism to actively deform the mask substrate, to thereby control the pattern magnification upon a membrane.

In this example, however, the mask is clamped at three locations in the peripheral portion of the mask frame, and mask frame deformation is produced by relatively moving the clamps. Thus, practically, it is difficult to correct the mask pattern as desired, particularly, to correct the magnification isotropically in X and Y directions.

SUMMARY OF THE INVENTION

It is an object of the present invention to provide an improved mask structure or an improved pattern transfer magnification correction method or system, by which with a simple arrangement, the transfer magnification of a mask pattern can be corrected precisely.

In accordance with an aspect of the present invention, there is provided a mask holding system, comprising: a chucking mechanism for holding a mask structure including a ring-like frame and a mask substrate having a rectangular window with a mask pattern; and a loading mechanism for applying a load to the frame in a direction along an extension of a diagonal of the rectangular window.

In accordance with another aspect of the present invention, there is provided a mask holding system, comprising: a chucking mechanism for holding a mask structure including (i) a mask substrate having a rectangular window with a mask pattern and (ii) a frame having a smaller-thickness portion with a level difference, in a peripheral portion thereof; and a loading mechanism for applying a load to the level difference portion of the frame.

In accordance with a further aspect of the present invention, there is provided a mask structure, comprising: a mask substrate having a rectangular window with a mask pattern; and a ring-like frame for supporting the mask substrate, wherein said ring-like frame has a rigidity in a direction of a diagonal of the rectangular window, which rigidity is relatively larger than that in another direction.

In accordance with a still further aspect of the present invention, there is provided a mask structure, comprising: a mask substrate having a rectangular window with a mask pattern; and a frame for supporting the mask substrate, wherein said frame has a smaller-thickness portion in a peripheral portion thereof, being disposed in a direction of or in a direction of extension of a diagonal of the rectangular window.

In accordance with a yet further aspect of the present invention, there is provided an exposure apparatus including any of the mask holding systems as recited above, for exposing a mask as held by said mask holding system.

In accordance with a yet further aspect of the present invention, there is provided a device manufacturing method, comprising the steps of: providing a mask structure including a ring-like frame and a mask substrate having a rectangular window with a mask pattern, as well as a wafer; correcting the mask pattern by applying a load to the frame in a direction along an extension of a diagonal of the rectangular window; and applying exposure energy to the mask structure and the wafer while holding the mask structure and the wafer in proximity to each other, to thereby transfer the mask pattern to the wafer.

In accordance with a yet further aspect of the present invention, there is provided a device manufacturing method, comprising the steps of: providing a mask structure including a ring-like frame and a mask substrate having a rectangular window with a mask pattern, the ring-like frame having a rigidity in a direction of a diagonal of the rectangular window which is relatively larger than that in another direction; providing a wafer; correcting the mask pattern by applying a load to the frame; and applying exposure energy to the mask structure and the wafer while holding the mask structure and the wafer in proximity to each other, to thereby transfer the mask pattern to the wafer.

In accordance with a yet further aspect of the present invention, there is provided a device manufacturing method, comprising the steps of: providing a mask structure including (i) a mask substrate having a rectangular window with a mask pattern and (ii) a frame having a smaller-thickness portion with a level difference, in a peripheral portion thereof; providing a wafer; correcting the mask pattern by applying a load to the level difference portion of the frame; and applying exposure energy to the mask structure and the wafer while holding the mask structure and the wafer in proximity to each other, to thereby transfer the mask pattern to the wafer.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

[Embodiment 1: Mask Structure and Holding and Correcting Method Therefor]

Figure 1:
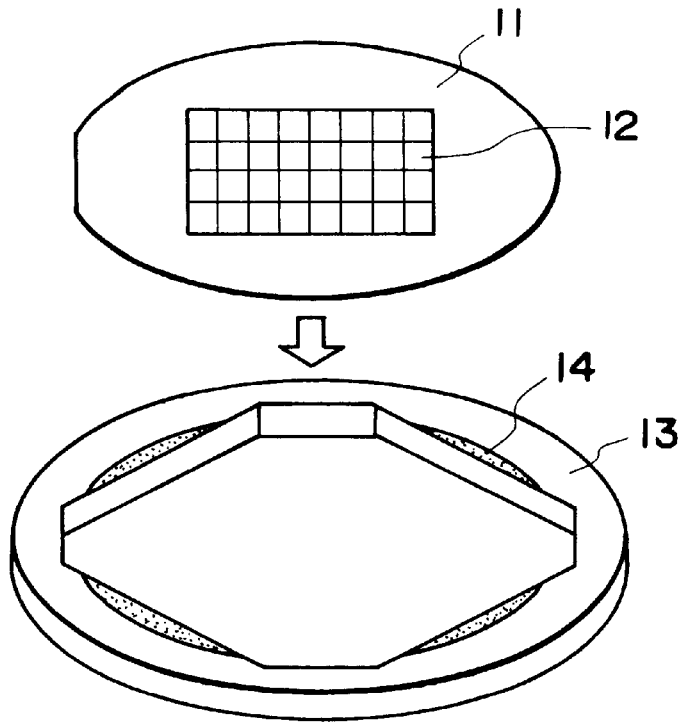
FIG. 1 is a schematic view of a mask structure according to a first embodiment of the present invention.

FIG. 1 is a schematic view of a transmission type mask structure to be used in a lithographic process based on a radiation beam such as X-rays, vacuum ultraviolet rays or an electron beam, for example. Denoted in the drawing at 11 is a circular mask substrate, which comprises a silicon wafer. It has an orientation flat (cut) portion for determining its rotational direction. Also, there is a window 12 of a square shape, at the center of the substrate, which window is a radiation beam transmitting region. For production of such a mask substrate, a film of SiN or SiC is formed on the surface of a Si substrate and, after this, only a portion of one side of the Si substrate, corresponding to the rectangular window, is removed by a back etching procedure such that only a SiN film or a SiC film (very thin membrane) remains there. A mask pattern to be transferred is then formed on this membrane, by use of a radiation absorptive material such as metal of Ta or W, for example. As will be described later, the mask pattern is formed with a slightly larger magnification to an idealistic transfer pattern size. This offset magnification is determined while taking into account the process distortion as predicted in relation to a wafer process after pattern transfer.

Denoted at 13 is a ring-line supporting frame for supporting and reinforcing the mask substrate. For the material of the supporting frame 13, preferably ceramics such as SiC or heat-resistive glass, for example, may be used. In FIG. 1, for explanation of the shape of the supporting frame, the mask substrate 11 and the supporting frame 13 are illustrated separately. Actually, however, they are combined into a single structure. The portions on the top surface of the supporting frame 13 as depicted by hatching are bonding regions to the mask substrate 11. Adhesive agent bonding or anodic bonding may be used for the bonding.

As seen in FIG. 1, the supporting frame 13 has a ring-like shape wherein it is circular at its outer periphery and it is octagonal at its inner periphery. The frame rigidity varies with the direction from the center. The supporting frame 13 is bonded to the mask substrate 11 to assure such a positional relation that the frame rigidity (frame sectional area) in a direction of an extension of a diagonal of the rectangular window is larger than that in a direction of an extension of a line passing the center and being parallel to a side of the rectangular shape.

Figure 2:
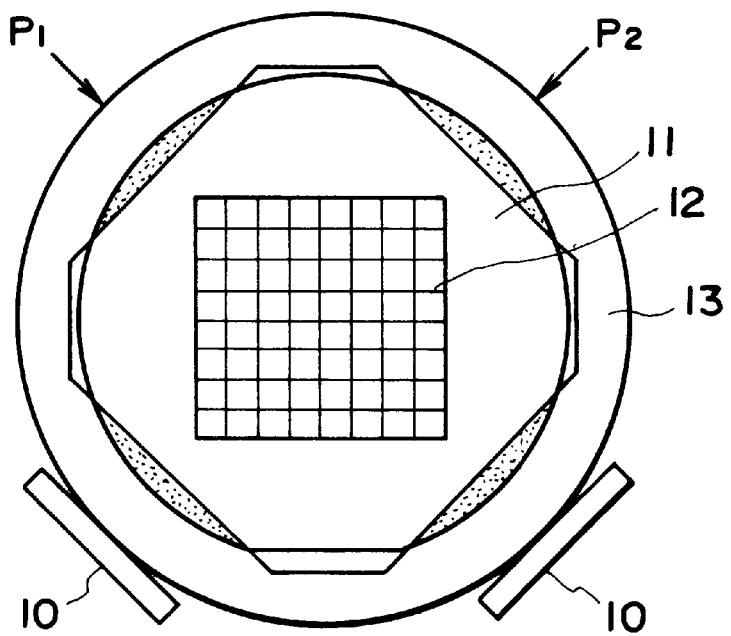
FIG. 2 is a schematic view for explaining the relation between a load to be applied to the mask structure of FIG. 1 and a rectangular window thereof.

FIG. 2 is a schematic view for explaining the relation between the rectangular window and a direction of application of a load to the supporting frame. More specifically, loads $P_1$ and $P_2$ ($P_1=P_2=P$) are applied in directions, toward the mask center, along extensions of diagonals of a rectangular window (of a square shape) of the mask substrate, respectively. There are two fixed abutment members 10 at positions opposed to extensions of vector directions of applied loads, respectively. As a result, a reactive force (P) is applied to the supporting frame 13, toward the mask center from the fixed members 10. In summary, in four directions along elongations of two diagonals of the rectangular window, forces are applied to the outside periphery of the supporting frame 13.

Figure 3:
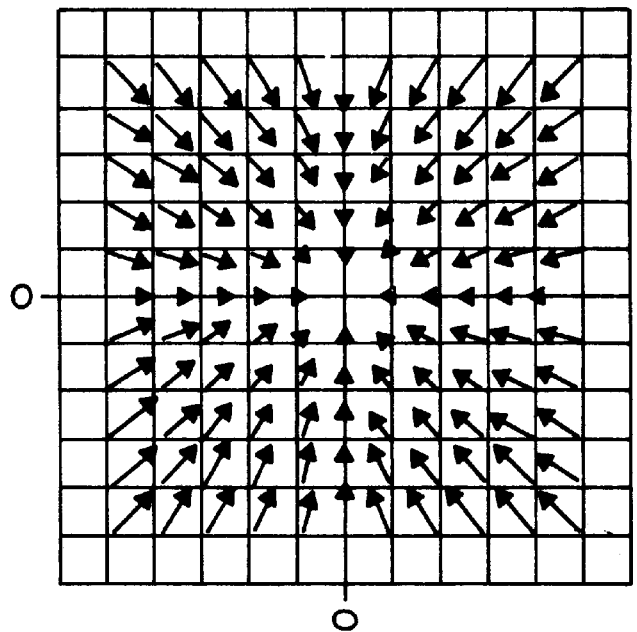
FIG. 3 is a schematic view for explaining, with vectors, a change in magnification of a mask pattern when a load is applied.

FIG. 3 is a schematic view of vectors, for explaining displacement of the pattern of the membrane of a rectangular window, produced as a result of load application in FIG. 2. As seen in FIG. 3, the mask pattern shows approximately isotropic displacement. More specifically, with respect to the smaller-rigidity diagonal directions of the rectangular window of the mask substrate 11, reinforcement is provided by larger-rigidity portions of the supporting frame 13. Also, with respect to the larger-rigidity lateral and longitudinal directions of the mask substrate, reinforcement is provided by smaller-rigidity portions of the supporting frame. As a result of a total balance, generally isotropic pattern displacement (reduction of magnification) is produced. If the applied loads $P_1$ and $P_2$ differ from each other, anisotropic magnification reduction is produced.

Figure 4:
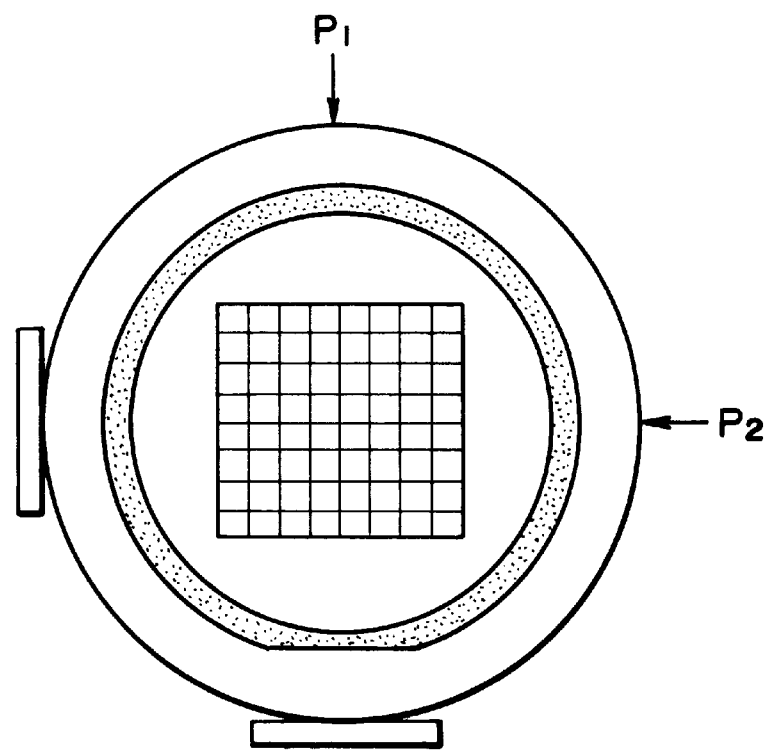
FIG. 4 is a schematic view of a comparative example.
Figure 5:
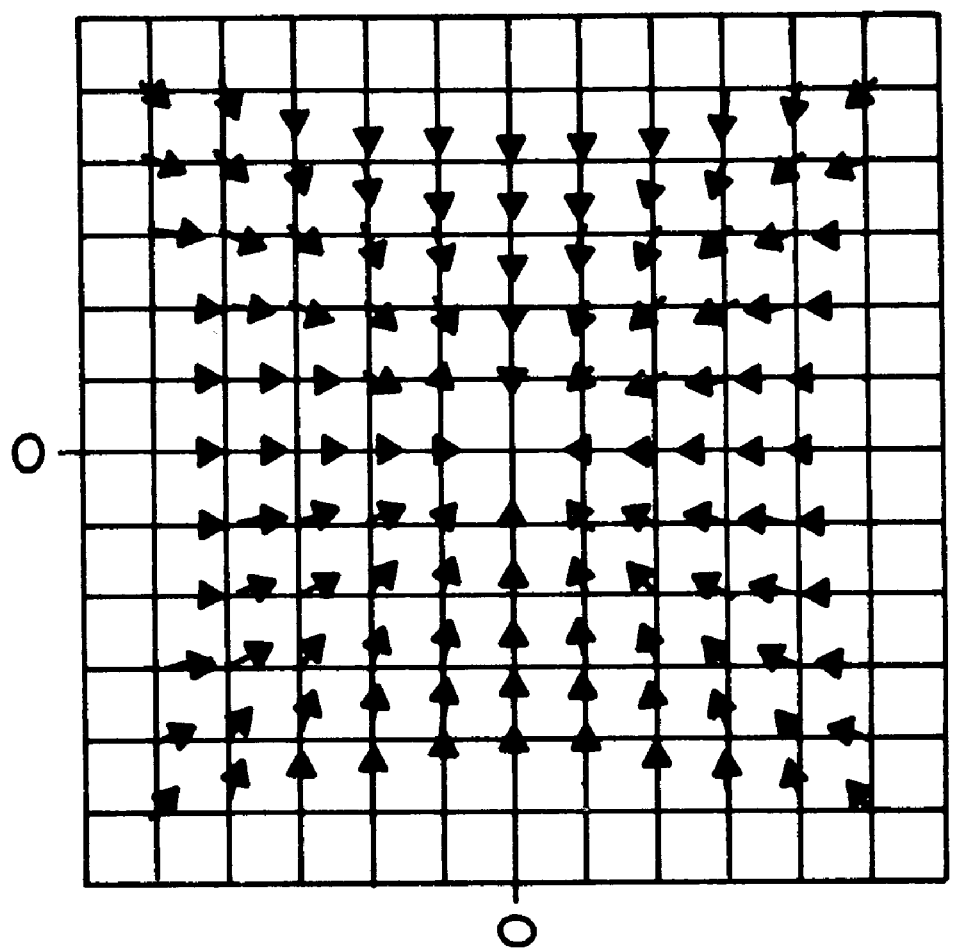
FIG. 5 is a schematic view of a comparative example to FIG. 3.

Now, a comparative example will be considered: a case where a supporting frame has uniform rigidity in any direction from the center (both of the inside and outside peripheries are circular) and where loads are applied in directions of sides of a rectangular window, not along the diagonal directions. As shown in FIG. 4, loads are applied toward the mask center in longitudinal and lateral directions with respect to the sides of the rectangular window (of square shape). Then, as seen in vectors of FIG. 5, there occurs spindle-like deformation wherein there is a smaller displacement at outside diagonal positions to the rectangular pattern and there is larger displacement at lateral and longitudinal positions from the center. Namely, as compared with isotropic and uniform reduction in FIG. 3, distorted reduction is produced and thus, the pattern distortion becomes larger.

In this embodiment, (1) a load is applied to the outside periphery of the supporting frame, in a direction of an extension of a diagonal of the rectangular window of the mask substrate, and (2) a mask used has a supporting frame having a relatively large rigidity in a diagonal direction of the rectangular window, as compared with that in another direction. With the combined effect of these features, optimum magnification correction with smallest distortion is assured. However, satisfactory magnification correction may be provided only with the feature (1), as compared with the examples of FIGS. 4 and 5. Therefore, the supporting frame may have a ring-like shape of isotropically uniform rigidity such as that shown in FIG. 4.

Figure 6:
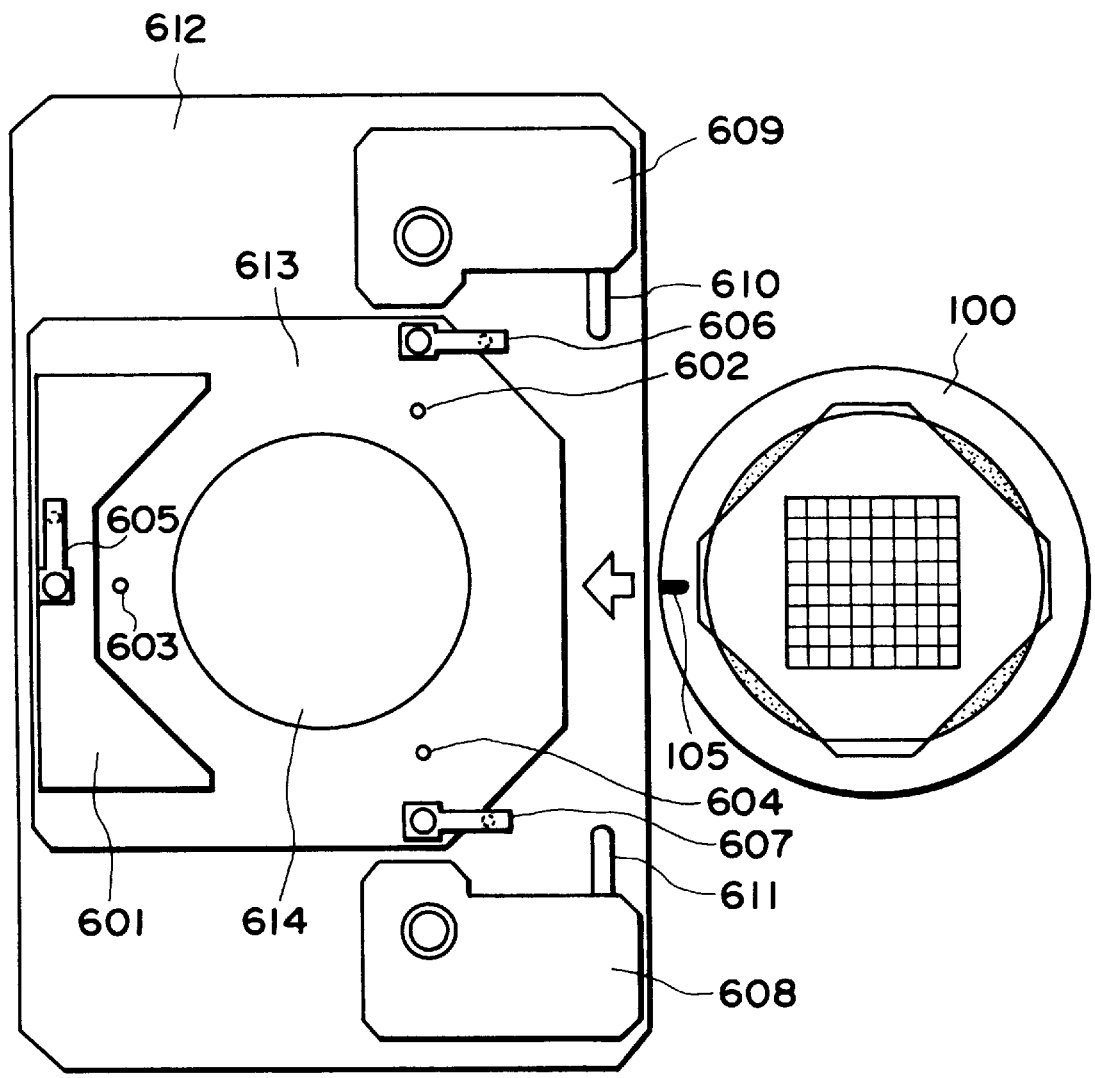
FIG. 6 is a schematic view of a mask holding system in a non-holding state.
Figure 7:
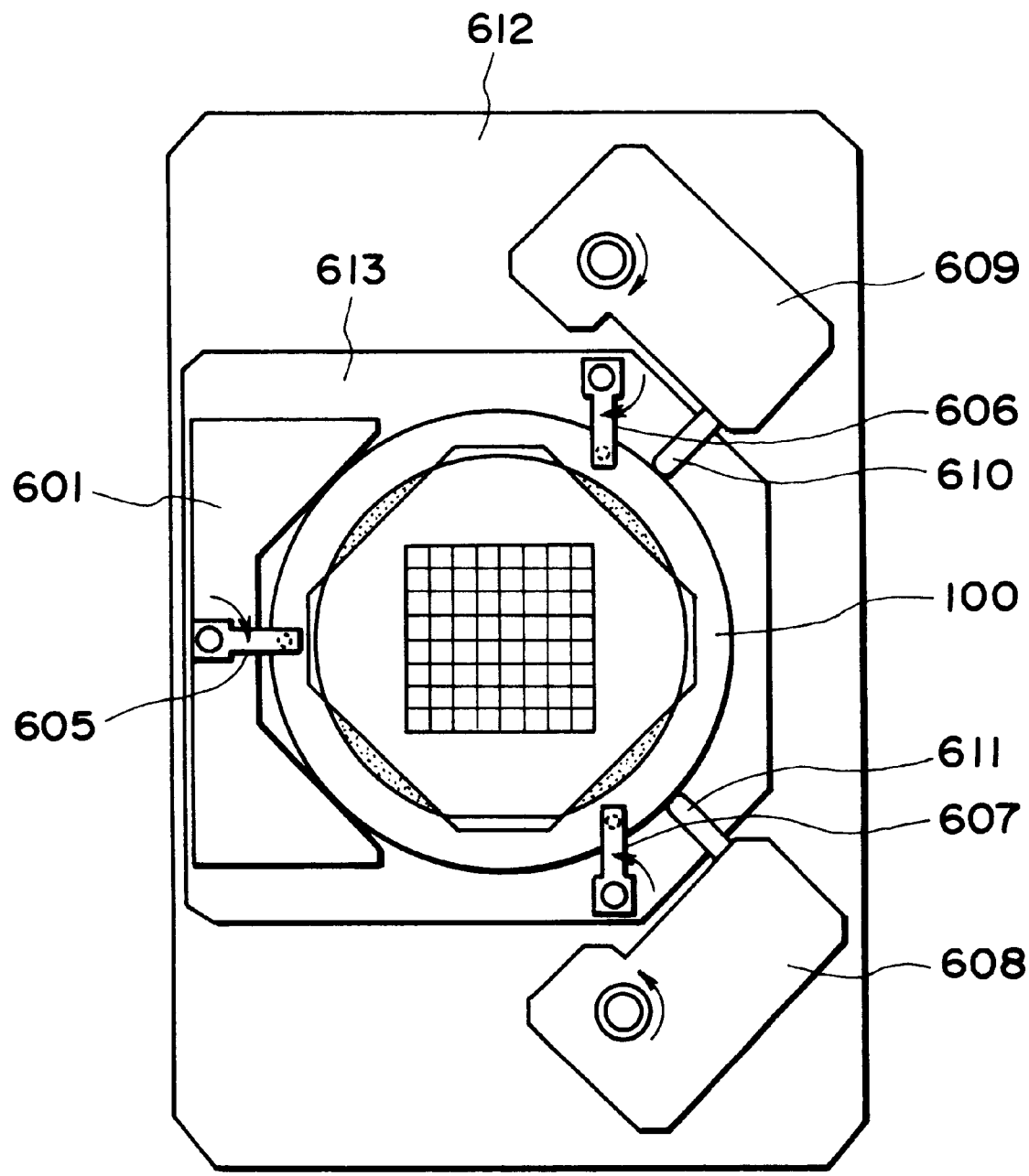
FIG. 7 is a schematic view of a mask holding system in a holding state.

Next, the structure and function of a mask holding system for holding the mask structure as described above, within an exposure apparatus, will be explained with reference to FIGS. 6 and 7. FIG. 6 shows the mask holding system in a non-holding state (not holding the mask structure), and FIG. 7 shows the same in a holding state.

There is a mask chuck 613 fixedly mounted on a base plate 612. There is an opening 614 formed through the base plate 612 and the mask chuck 613, at the position where an exposure radiation beam is to pass therethrough. The mask chuck 613 is provided with a block 601 against which the mask structure is to be abutted and positioned thereby. The block 601 has two abutment faces to be contacted to the supporting frame of the mask structure at two points, which faces extend perpendicularly to each other as seen from above. Formed on the base plate 612 are three protrusions 602, 603 and 604 having ball-like free ends, for supporting the mask. Also, there are three rotational arms 605, 606 and 607 corresponding to the three protrusions. Each arm has a protrusion at its free end. These three protrusions are disposed in a regular triangular shape. When the mask structure is held by the chucking mechanism, one of the three protrusions is placed in a direction of an extension of a line passing the center of the rectangular window and being parallel to a side of the rectangular shape.

The base plate 612 is further provided with two loading units 608 and 609 which are rotationally movable to apply loads to the outside periphery of the mask supporting frame, in two directions. Each loading unit comprises a rod, a detector (load cell) for detecting a reactive force responsive to the application of a load by the rod, and an actuator for rotating the loading unit itself.

In operation with the arrangement described above, the mask structure 100 is conveyed by a conveying arm (not shown) and is brought into abutment with the two abutment faces of the block 601, whereby horizontal positioning with respect to X and Y directions is performed. Then, by means of the three points of the mask chuck protrusions 602, 603 and 604, the bottom face of the mask structure 100 is supported. Then, the three arms 605, 606 and 607 are rotationally moved, and the mask frame is held at three locations, by vertical sandwiching. Thus, positioning of the mask in all directions of X, Y and Z is completed. At this moment, the protrusion of the arm 605 engages with a V-shaped groove 105 formed on the top surface of the frame of the mask structure, to prevent a shift in the rotational direction.

Subsequently, the loading units 608 and 609 are rotated toward the mask and, as shown in FIG. 7, the free ends of the rods 610 and 611 of the loading units are brought into abutment with the supporting frame of the mask structure. The rods 610 and 611, thus being contacted, function to apply loads toward the mask center, and the directions of load application are perpendicular to each other. In summary, as a result of the above, loads are applied to the outside periphery of the mask supporting frame, in four directions along extensions of the diagonals of the rectangular window of the mask.

The mask pattern of the mask structure has been formed with a size larger than a predetermined design size, by an amount corresponding to a specified displacement to be produced by magnification correction. Prior to the exposure process, the magnification of the mask and wafer patterns may be measured by use of an alignment measurement system provided in the exposure apparatus, and set loads to be applied to the mask for necessary magnification correction may be determined. The load setting may be made on the basis of the relation between the mask pattern displacement amount and the set load to be applied to the mask, which relation may be stored beforehand in a control system, in the form of a data table or conversion formulae.

Subsequently, a voltage is applied to the actuator so that the load as detected by the load cell becomes equal to the set load. The actuator drive may be servo-controlled on the basis of an output of the load cell and, on that occasion, a constant load may be stably applied to the mask structure even when minute motion occurs in the mask. Further, such servo control may be made continuously even during the exposure process and, on that occasion, correction may be made also to a change in pattern magnification due to thermal distortion, produced by the exposure beam.

[Modified Examples of Mask Structure]

Modified examples of the mask structure will now be described. In any of these examples, a load is applied to the supporting frame in a direction of an extension of a diagonal of a rectangular window on which the mask pattern is formed. Also, in these examples, the mask structure comprises a mask substrate having a rectangular window with a mask pattern, and a ring-like supporting frame for reinforcing the mask substrate, wherein the supporting frame has a relatively large rigidity in a direction of a diagonal of the rectangular window as compared with that in another direction. The mechanism for folding the mask and for applying a load to it, may have the same structure as has been described with reference to FIGS. 6 and 7, and further description thereof will be omitted here.

Figure 8:
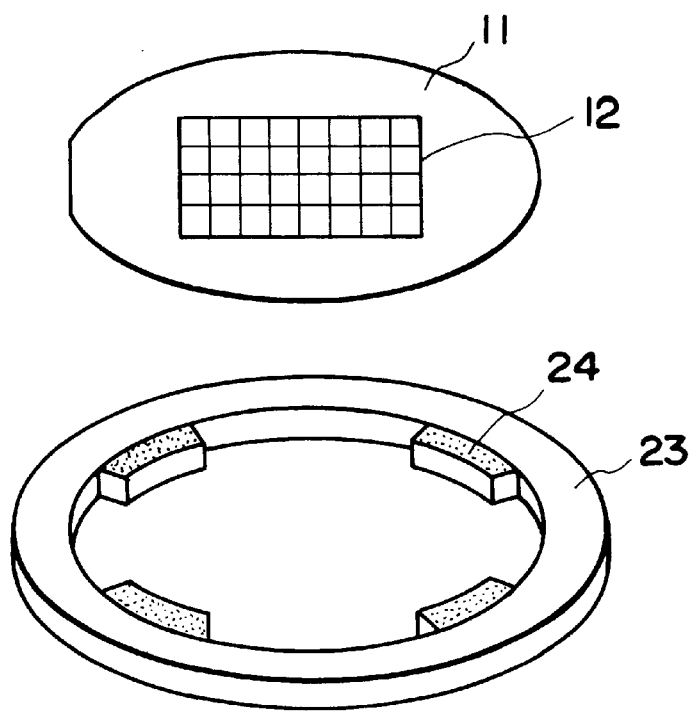
FIG. 8 is a schematic view of a mask structure of a modified example.
Figure 9:
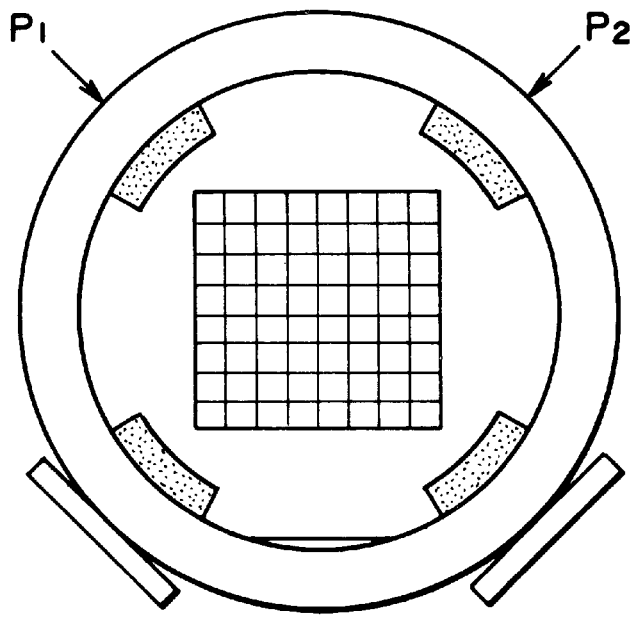
FIG. 9 is a schematic view for explaining the relation between a load to be applied to the mask structure of FIG. 8 and the rectangular window thereof.

FIGS. 8 and 9 show a modified example of a mask structure. A ring-like supporting frame 23 is provided with four protrusions 24 at four locations which are in directions of extensions of diagonals of a rectangular window 11 (of square shape) of the mask substrate 12. Top faces of these protrusions 24 provide bonding faces to the mask substrate.

Figure 10:
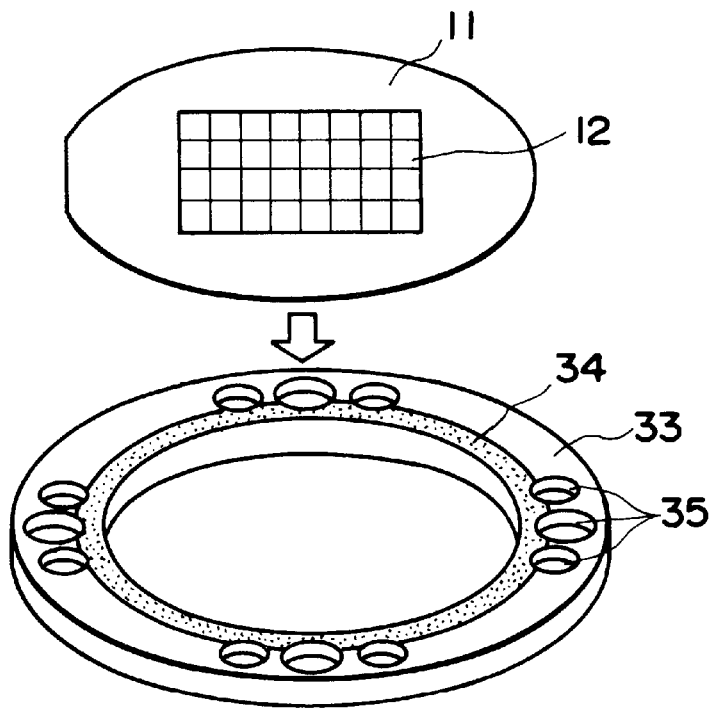
FIG. 10 is a schematic view of a mask structure of a modified example.
Figure 11:
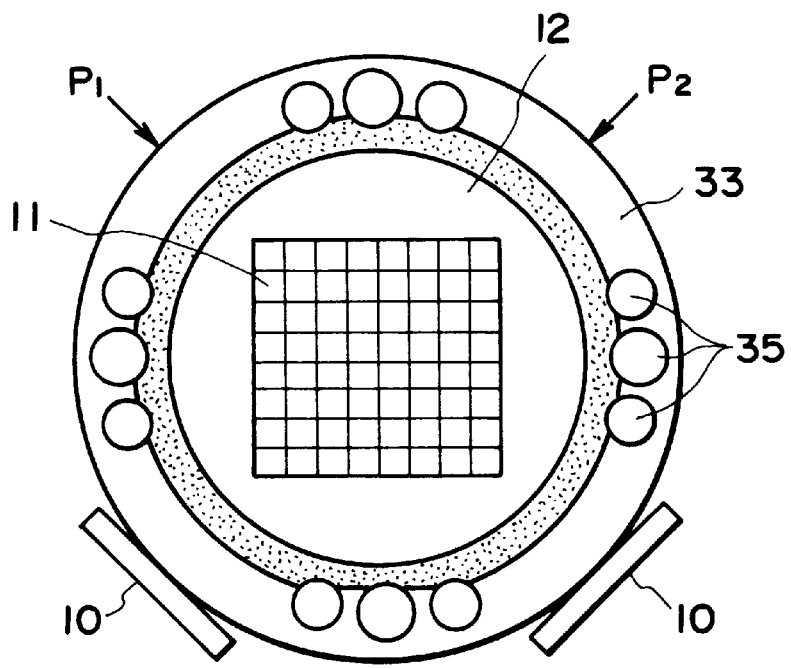
FIG. 11 is a schematic view for explaining the relation between a load to be applied to the mask structure of FIG. 9 and the rectangular window thereof.

FIGS. 10 and 11 show another modified example of a mask structure. In this example, the supporting frame has such a shape that large and small holes 35 are formed uniformly, in relation to the rectangular window (of square shape) of the mask substrate to be bonded to the supporting frame, which holes are disposed in four directions along lateral and longitudinal directions of the rectangular shape of the window. The number and disposition of these holes are not limited to the example disclosed. What is necessary is that, in the relation with the rectangular window of the mask substrate, the rigidity of the frame in the direction of an extension of the diagonal is relatively larger than that in another direction.

Figure 12:
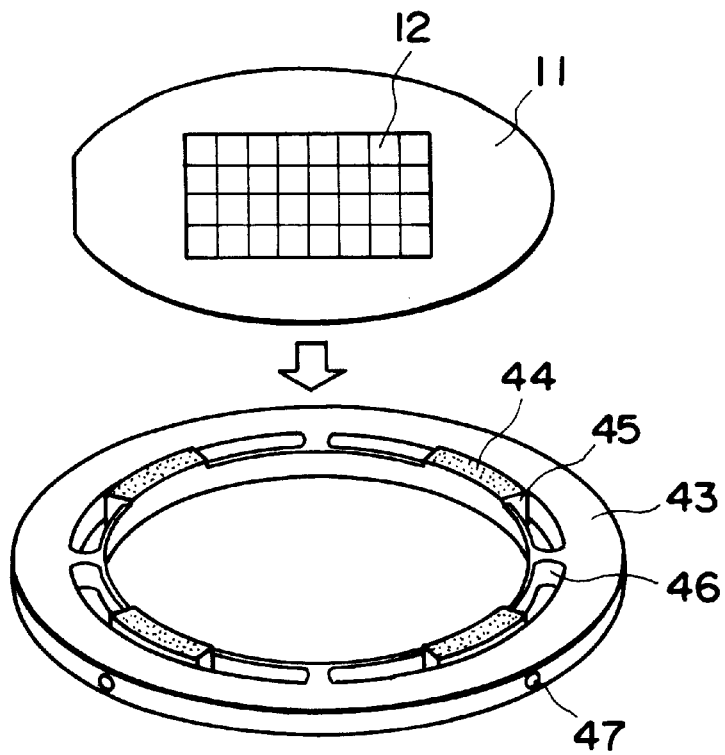
FIG. 12 is a schematic view of a mask structure of a modified example.
Figure 13:
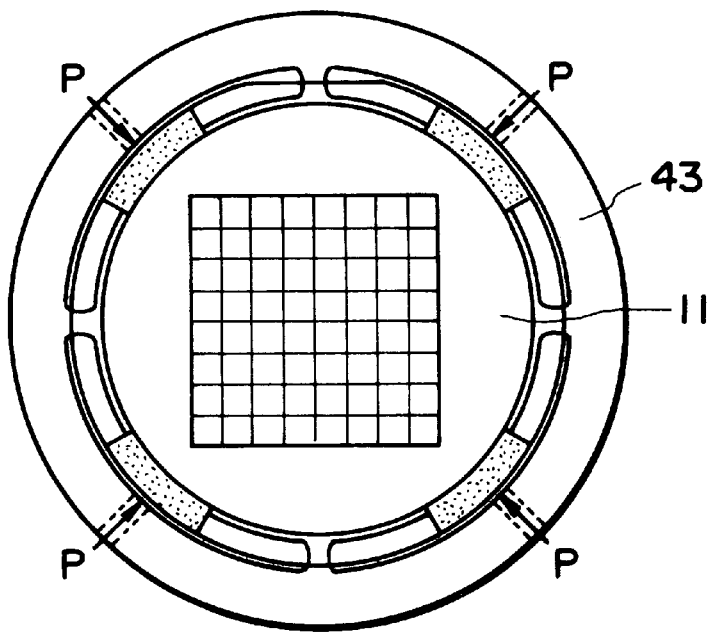
FIG. 13 is a schematic view for explaining the relation between a load to be applied to the mask structure of FIG. 12 and the rectangular window thereof.

FIGS. 12 and 13 show a further modified example of a mask structure. There are four islands 45 which are provided independently from the supporting frame 43 and which are supported by leaf springs 46. Top faces of the islands 45 provide bonding faces to the mask substrate. These islands 45 are disposed in directions of extensions of diagonals of the rectangular window of the mask substrate. Also, there are four small bores 47 formed at the outside circumferential surface of the frame, which extend through the frame toward the mask center.

For magnification correction, as seen in FIG. 13, four rod members having ball-like free ends are inserted into the four bores 47, respectively, for uniform application of a load P with these rods. In this example, a load can be applied to the mask substrate, independently of the frame outside periphery. Thus, there occurs no pattern distortion when the frame is chucked. Further enhancement of precision of magnification correction is thus assured.

[Embodiment 2: Mask Structure and Holding and Correcting Method Therefor]

Figure 14:
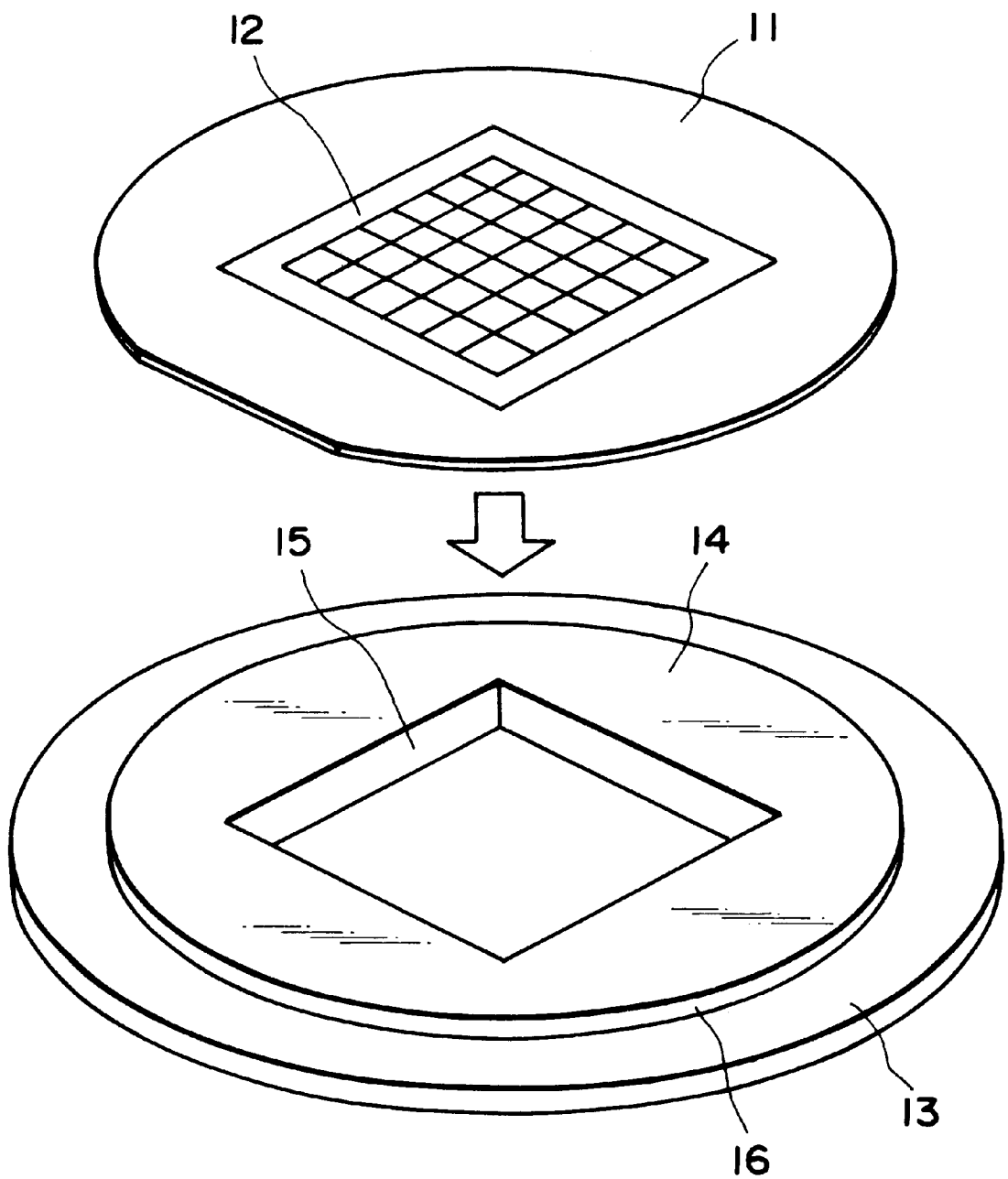
FIG. 14 is a schematic view of a mask structure according to a second embodiment of the present invention.

FIG. 14 is a schematic view of a transmission type mask structure to be used in a lithographic process based on a radiation beam such as X-rays, vacuum ultraviolet rays or an electron beam, for example. Denoted in the drawing at 11 is a circular mask substrate, which comprises a silicon wafer. It has an orientation flat (cut) portion for determining its rotational direction. Also, there is a window 12 of a square shape, at the center of the substrate, which window is a radiation beam transmitting region. For production of such a mask substrate, a film of SiN or SiC is formed on the surface of a Si substrate and, after this, only a portion of one side of the Si substrate, corresponding to the rectangular window, is removed by a back etching procedure such that only a SiN film or SiC film (very thin membrane) remains there. A mask pattern to be transferred is then formed on this membrane, by use of a radiation absorptive material such as a metal of Ta or W, for example. As will be described later, the mask pattern is formed with a slightly larger magnification to an idealistic transfer pattern size. This offset magnification is determined while taking into account the process distortion as predicted in relation to a wafer process after pattern transfer.

Denoted at 13 is a ring-like supporting frame for supporting and reinforcing the mask substrate. For the material of the supporting frame 13, preferably ceramics such as SiC or heat-resistive glass, for example, may be used. As seen in FIG. 14, the supporting frame 13 has a ring-like shape with a circular outer periphery. Inside the frame, there is a rectangular region having been removed to define a throughbore 15 corresponding to the rectangular window of the mask substrate. The shape of the throughbore 15 is not limited to rectangular, and it may be circular.

Figure 15:
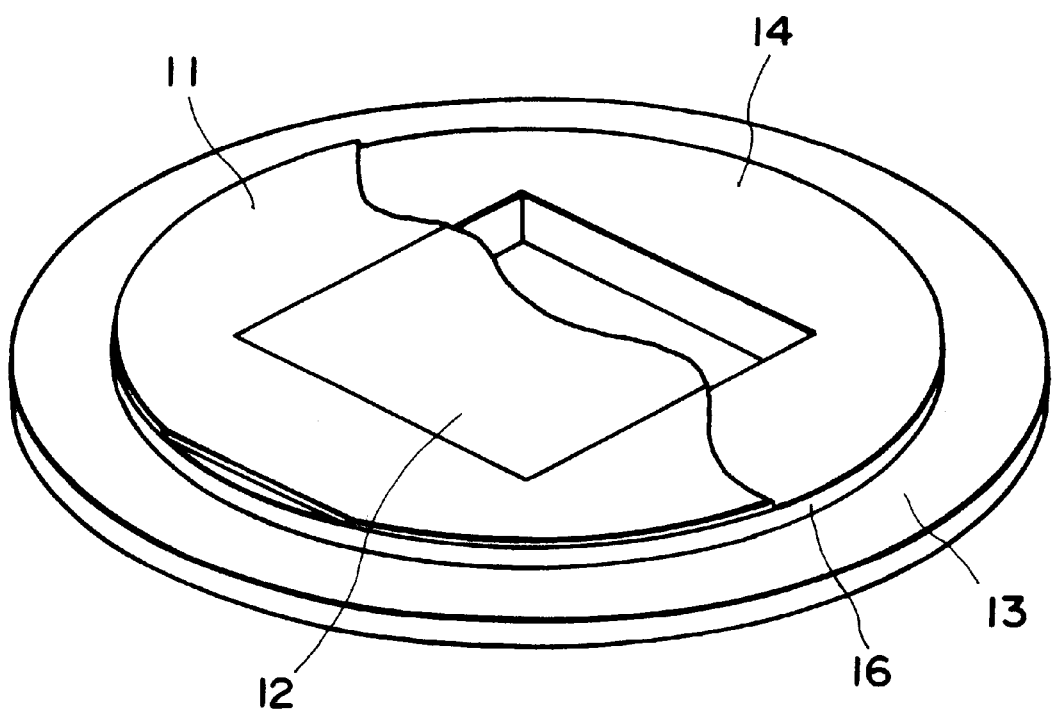
FIG. 15 is a schematic view of the mask structure of FIG. 14, as assembled.

As shown in FIG. 14, the supporting frame 13 is provided with a smaller-thickness portion along the outside circumferential portion thereof, being defined by cutting the top surface portion. The frame thus has such a structure that, when it is seen from the side face, the frame is formed with a level difference (step) 16. The circumference at the upper level of the supporting frame 13 has approximately the same size as the circumference of the mask substrate. The top face of the upper level of the supporting frame, that is, the portion 14 as depicted by hatching, provides a bonding face to the mask substrate 11. Bonding may be performed on the basis of adhesive agent bonding or anodic bonding, for example. In FIG. 14, for explanation of the shape of the supporting frame, the mask substrate 11 and the supporting frame 13 are illustrated separately. Actually, however, they are combined into a single structure as shown in FIG. 15.

Figure 16:
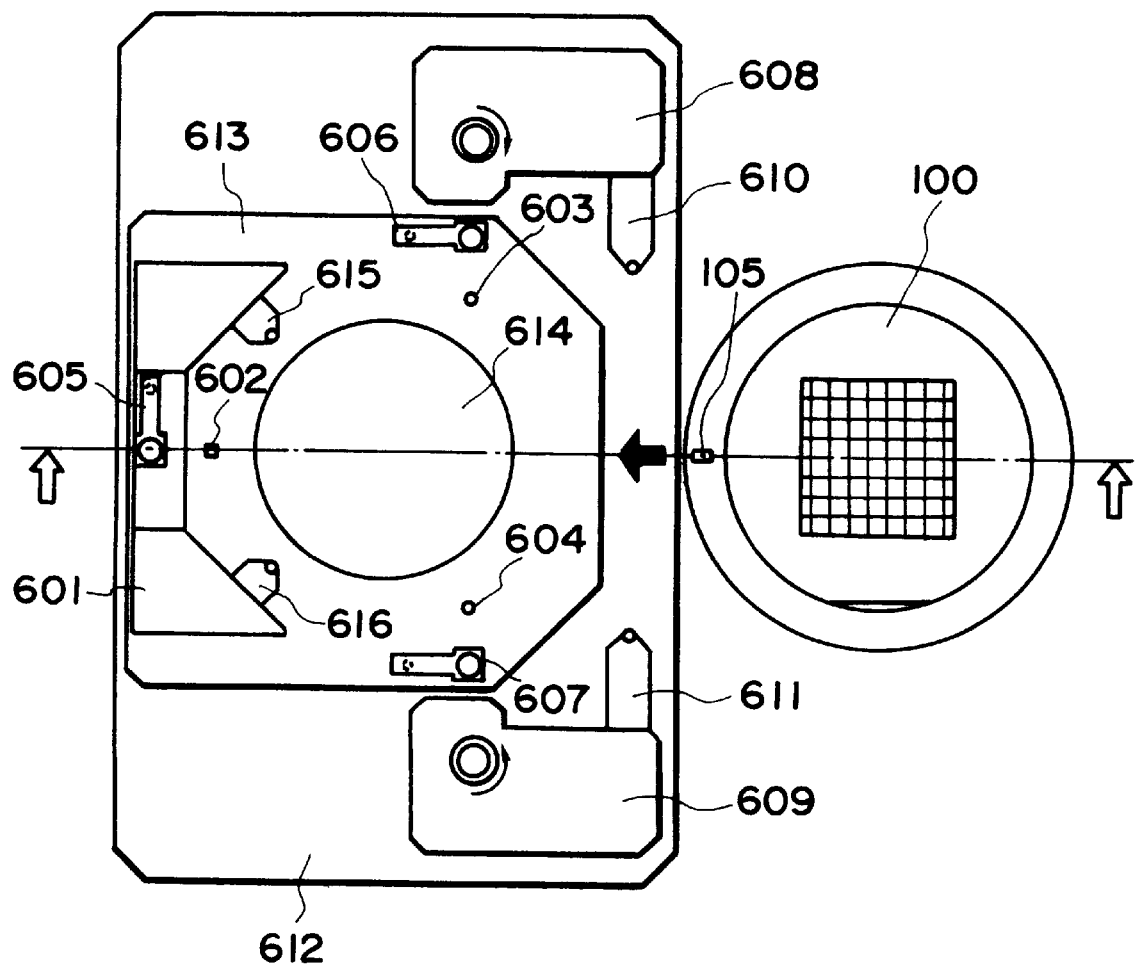
FIG. 16 is a top plan view of a mask holding system in a non-holding state.
Figure 17:
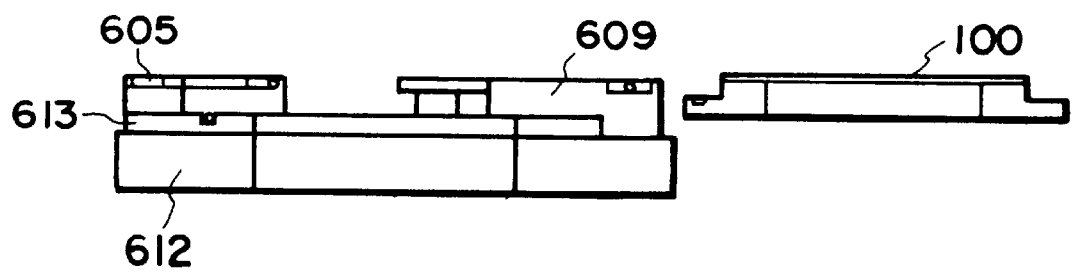
FIG. 17 is a sectional view of the mask holding system of FIG. 16.
Figure 18:
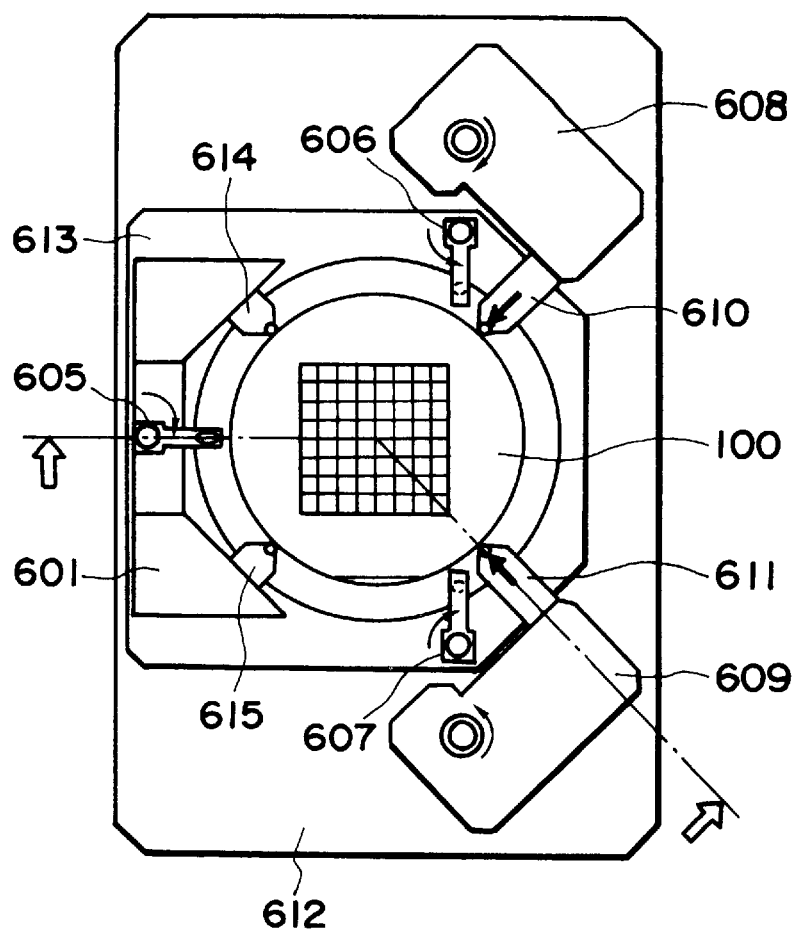
FIG. 18 is a top plan view of a mask holding system in a holding state.
Figure 19:
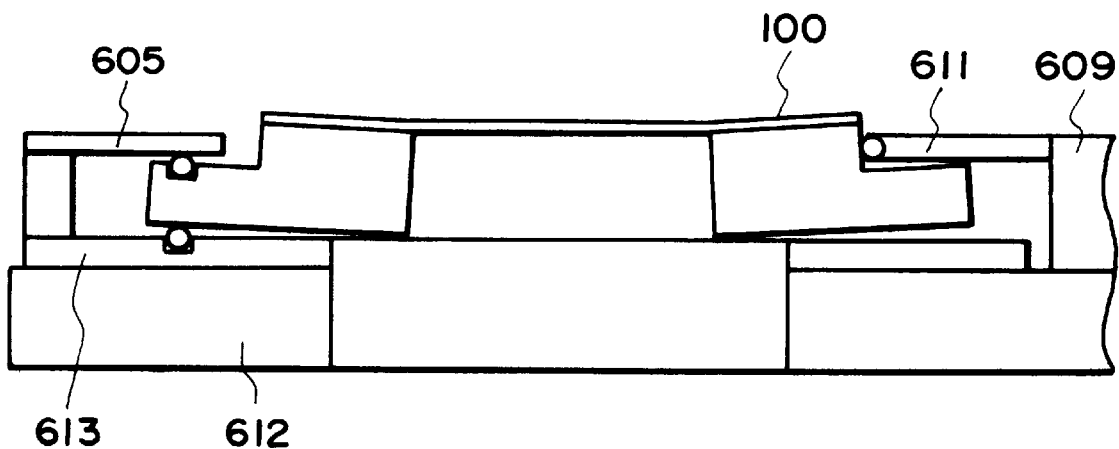
FIG. 19 is a sectional view of the mask holding system of FIG. 18.

Next, the structure and function of a mask holding system for holding the mask structure as described above, within an exposure apparatus, will be explained with reference to FIGS. 16–19. FIG. 16 shows the mask holding system in a mask structure non-holding state (not holding the mask structure), and FIG. 17 is a sectional view taken on a section depicted by arrows in FIG. 16. FIG. 18 shows the mask holding device in a mask structure holding state. FIG. 19 is a sectional view taken on a section as depicted by arrows in FIG. 18.

There is a mask chuck 613 fixedly mounted on a base plate 612. There is an opening 614 formed through the base plate 612 and the mask chuck 613, at the position where an exposure radiation beam is to pass therethrough. The mask chuck 613 is provided with a block 601 against which the mask structure is to be abutted and positioned thereby. The block 601 has two abutment faces to be contacted to the supporting frame of the mask structure at two points, which faces extend perpendicularly to each other as seen from above. Formed on the base plate 612 are three protrusions 602, 603 and 604 having ball-like free ends, for supporting the mask. Also, there are three rotational arms 605, 606 and 607 corresponding to the three protrusions. Each arm has a protrusion at its free end. These three protrusions are disposed in a regular triangular shape. When the mask structure is held by the chucking mechanism, one of the three protrusions is placed in a direction of a extension of a line passing the center of the rectangular window and being parallel to a side of the rectangular shape.

The base plate 612 is further provided with two loading units 608 and 609 which are rotationally movable to apply loads to the outside periphery of the mask supporting frame, in two directions. Each loading unit comprises a rod, a detector (load cell) for detecting a reactive force responsive to the application of a load by the rod, and an actuator for rotating the loading unit itself.

In operation with the arrangement described above, the mask structure 100 is conveyed by a conveying arm (not shown) and is brought into abutment with the two abutment faces of the block 601, whereby horizontal positioning with respect to X and Y directions is performed. Then, by means of the three points of the mask chuck protrusions 602, 603 and 604, the bottom face of the mask structure 100 is supported. Then, the three arms 605, 606 and 607 are rotationally moved, and the mask frame is held at three locations, by vertical sandwiching. Thus, positioning of the mask in all directions of X, Y and Z is completed. At this moment, the protrusion of the arm 605 engages with a V-shaped groove 105 formed on the top surface of the frame of the mask structure, to prevent a shift in the rotational direction.

Subsequently, the loading units 608 and 609 are rotated toward the mask and, as shown in FIGS. 18 and 19, the free ends of the rods 610 and 611 of the loading units are brought into abutment with the step of the supporting frame of the mask structure. The rods 610 and 611, thus being contacted, function to apply loads toward the mask center, and the directions of load application are perpendicular to each other. In summary, as a result of the above, loads are applied to the outside periphery of the mask supporting frame, in four directions along extensions of the diagonals of the rectangular window of the mask.

The mask pattern of the mask structure has been formed with a size larger than a predetermined design size, by an amount corresponding to a specified displacement to be produced by magnification correction. Prior to the exposure process, the magnification of the mask the and wafer patterns may be measured by use of an alignment measurement system provided in the exposure apparatus, and set loads to be applied to the mask for necessary magnification correction may be determined. The load setting may be made on the basis of the relation between the mask pattern displacement amount and the set load to be applied to the mask, which relation may be stored beforehand in a control system, in the form of a data table or conversion formulae.

Subsequently, a voltage is applied to the actuator so that the load as detected by the load cell becomes equal to the set load. The actuator drive may be servo-controlled on the basis of an output of the load cell and, on that occasion, a constant load may be stably applied to the mask structure even when minute motion occurs in the mask. Further, such servo control may be made continuously even during the exposure process and, on that occasion, correction may be made also to a change in pattern magnification due to thermal distortion, produced by the exposure beam.

Figure 20:
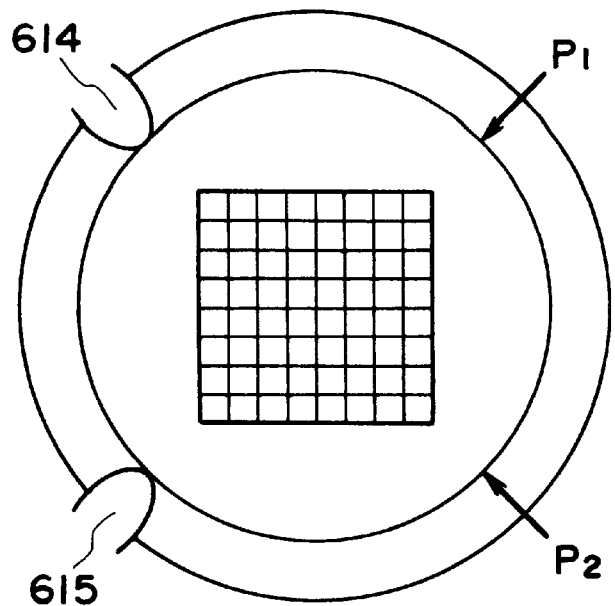
FIG. 20 is a schematic view for explaining the relation between a load to be applied to a mask structure and a rectangular window thereof.

FIG. 20 is a schematic view for explaining the relation between the rectangular window and directions of load application to the supporting frame. More specifically, loads $P_1$ and $P_2$ ($P_1=P_2=P$) are applied in directions, toward the mask center, along extensions of diagonals of a rectangular window (of square shape) of the mask substrate, respectively. There are two fixed abutment members 614 and 615 at positions opposed to extensions of vector directions of applied loads, respectively. As a result, a reactive force (P) is applied to the supporting frame 13, toward the mask center from the fixed members 614 and 615. In summary, in four directions along extensions of two diagonals of the rectangular window, forces are applied to the step of the supporting frame 14 (of a two-level structure), that is, to the outside circumference of the upper level circle of the supporting frame.

Here, as shown in FIG. 19, since the position of load application to the supporting frame is not at the height center of the side face of the supporting frame, a moment is produced which causes a small warp in the supporting frame and in the mask substrate combined in a unit structure with the supporting frame. As a result of this, a small reduction is produced in the membrane attached to the rectangular window. FIG. 19 shows the warp of the frame, with exaggeration. By producing a small reduction in the whole membrane, the magnification of the mask pattern formed thereon can be changed.

Figure 21:
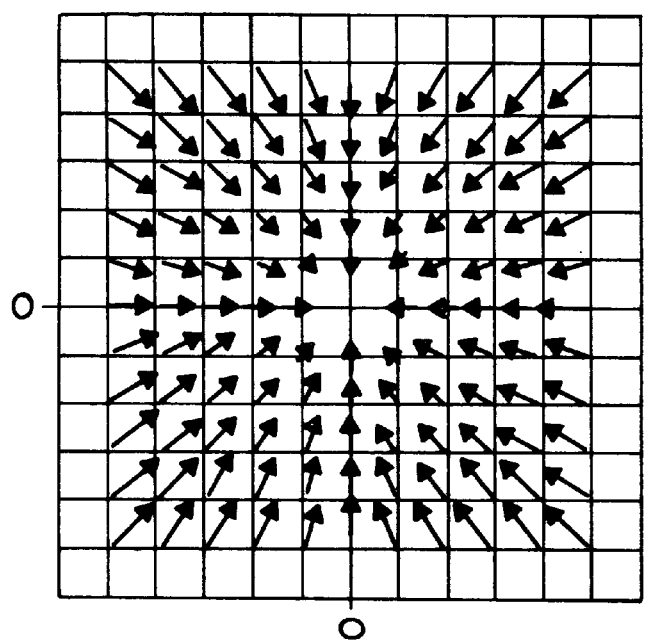
FIG. 21 is a schematic view for explaining, with vectors, a change in magnification of a mask pattern when a load is applied.

FIG. 21 is a schematic view of vectors, for explaining displacement of the pattern of the membrane of a rectangular window, produced as a result of load application in FIG. 20. As seen in FIG. 21, the mask pattern shows approximately isotropic displacement. This is because: there is a mode in which the mask pattern on the membrane is reduced as a result of application of forces in diagonal directions, along the surface of the mask substrate, and also, there is a mode in which the mask pattern on the membrane is reduced as a result of warp of the mask substrate. Due to the combined effect of these modes, generally isotropic pattern displacement (reduction of magnification) is produced. If the applied loads $P_1$ and $P_2$ differ from each other, anisotropic magnification reduction is produced.

Figure 22:
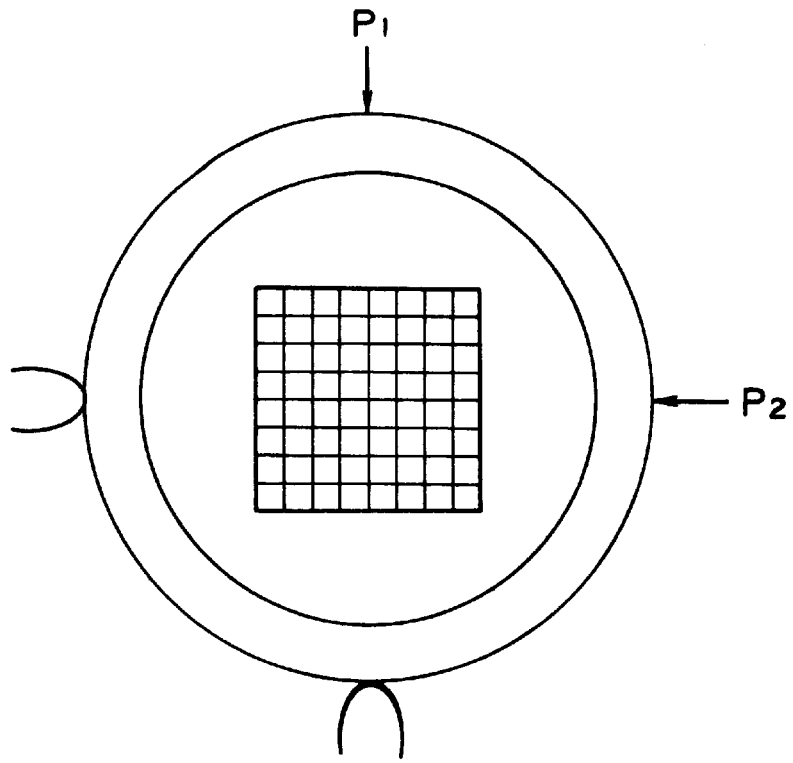
FIG. 22 is a schematic view of a comparative example.
Figure 23:
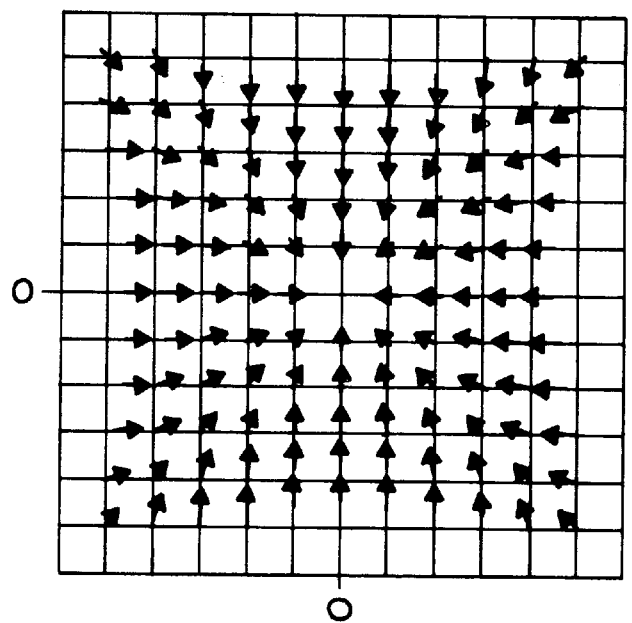
FIG. 23 is a schematic view of a comparative example to FIG. 21.

Now, a comparative example will be considered: a case where a supporting frame has a plate-like shape without a step (level difference) and where loads are applied in directions of sides of a rectangular window, not along the diagonal directions. As shown in FIG. 22, loads are applied toward the mask center in longitudinal and lateral directions with respect to the sides of the rectangular window (of square shape). Then, as seen in vectors of FIG. 23, there occurs spindle-like deformation wherein there is a smaller displacement at outside diagonal positions to the rectangular pattern and there is larger displacement at lateral and longitudinal positions from the center. Namely, as compared with the isotropic and uniform reduction in FIG. 21, distorted reduction is produced and thus, the pattern distortion becomes larger.

In this embodiment: (1) a mask structure comprises a mask substrate having a rectangular window with a mask pattern as well as a ring-like frame for reinforcing the mask substrate and having a step (level difference) as seen from the side face, to which level difference a load is applied; and (2) a load is applied to the level difference portion of the supporting frame, in a direction of an extension of a diagonal of the rectangular window. With the combined effect of these features, optimum magnification correction with smallest distortion is assured. However, satisfactory magnification correction may be provided only with the feature (1) or feature (2), as compared with the examples of FIGS. 22 and 23. Therefore, the mask structure may be formed with only one of these features.

[Modified Examples of Mask Structure]

Figure 24:
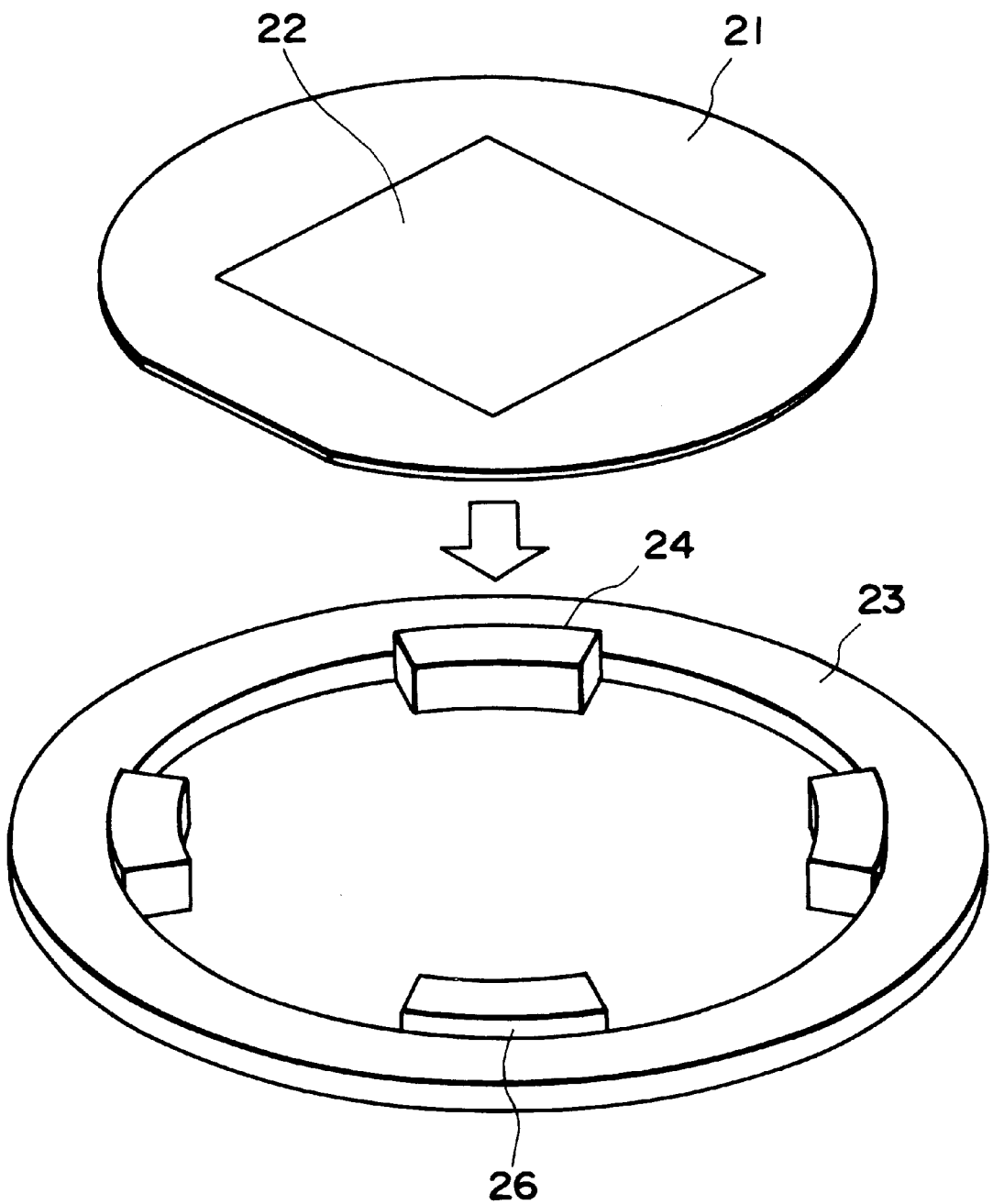
FIG. 24 is a schematic view of a mask structure of a modified example.
Figure 25:
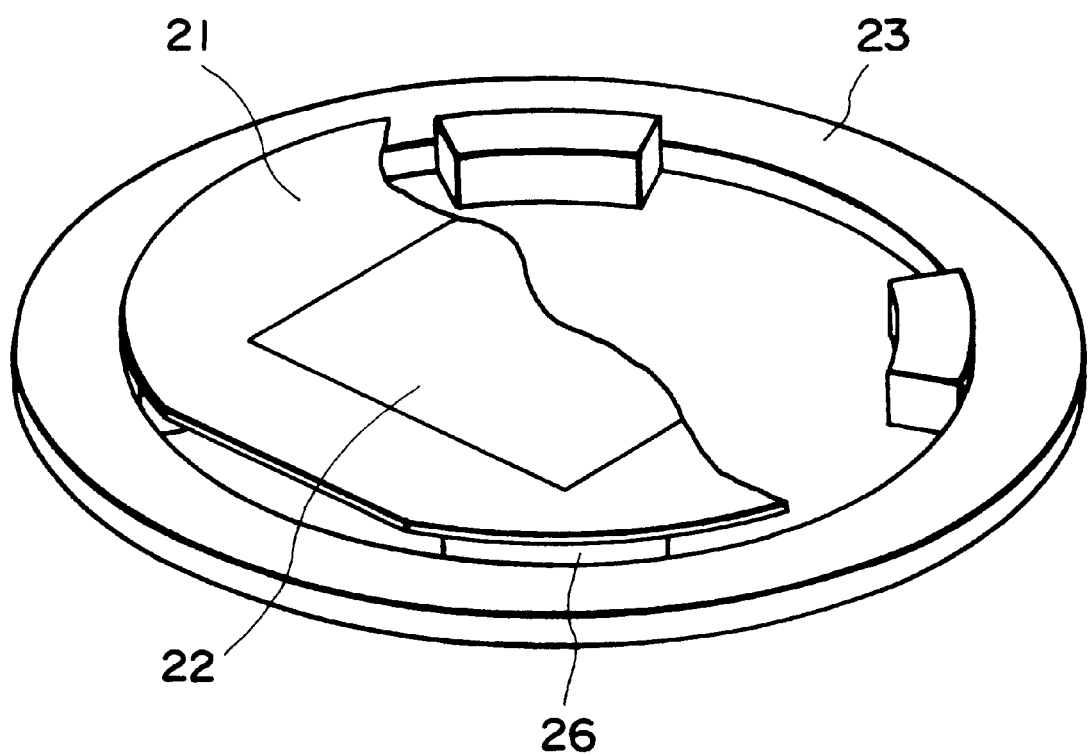
FIG. 25 is a schematic view for explaining the relation between a load to be applied to the mask structure of FIG. 21 and the rectangular window thereof.

A modified example of a mask structure will be described with reference to FIGS. 24 and 25. In FIG. 24, a plate-like ring 23 is provided with four protrusions 24 formed at the inside periphery thereof, which protrusions are disposed in directions of extensions of diagonals of a rectangular window 22 (of square shape) of a mask substrate 21. Each protrusion 24 may comprise a separate member bonded to the ring 23, or it may be formed integrally with the ring. The plate-like ring 23 and the protrusions 24 are combined to provide a supporting frame. The protrusion 24 has a thickness larger than that of the plate-like ring, and a step (level difference) 26 for load application to the supporting frame is defined at the junction between them. In other words, the whole of the plate-like ring 23 provides a smaller-thickness portion of the supporting frame.

The top face of each protrusion 24 provides a bonding face to the mask substrate 21. The outside circle as defined by these four protrusions 24 approximately corresponds to the outside circumference of the mask substrate 21, such that the mask frame and the mask substrate are bonded as shown in FIG. 25.

In this example, like the preceding embodiment, the mask structure comprises a mask substrate having a rectangular window with a mask pattern as well as a ring-like frame for reinforcing the mask substrate and having a step (level difference) as seen from the side face, to which level difference a load is applied. Also, a load is applied to the level difference portion of the supporting frame, in a direction of an extension of a diagonal of the rectangular window where the mask pattern is formed.

Since the mechanism for applying loads to the mask structure may have the same structure as of that having been described with reference to FIGS. 16–19, a duplicate explanation will be omitted here.

An important feature is that a load is applied to the level difference portion of the supporting frame, in a direction of an extension of a diagonal of the rectangular window. Thus, there may be an alternative: If a smaller-thickness portion of the supporting frame is provided at least in a frame peripheral portion which is in a direction of an extension of a diagonal of the rectangular window, a load can be applied to the level difference portion (step). Thus, in place of providing the smaller-thickness portion over the whole peripheral portion of the supporting frame as shown in FIG. 24, smaller-thickness portions may be defined only in those peripheral portions which are in four directions along extensions of the two diagonals of the frame.

[Embodiment 3: Exposure Apparatus]

Figure 26:
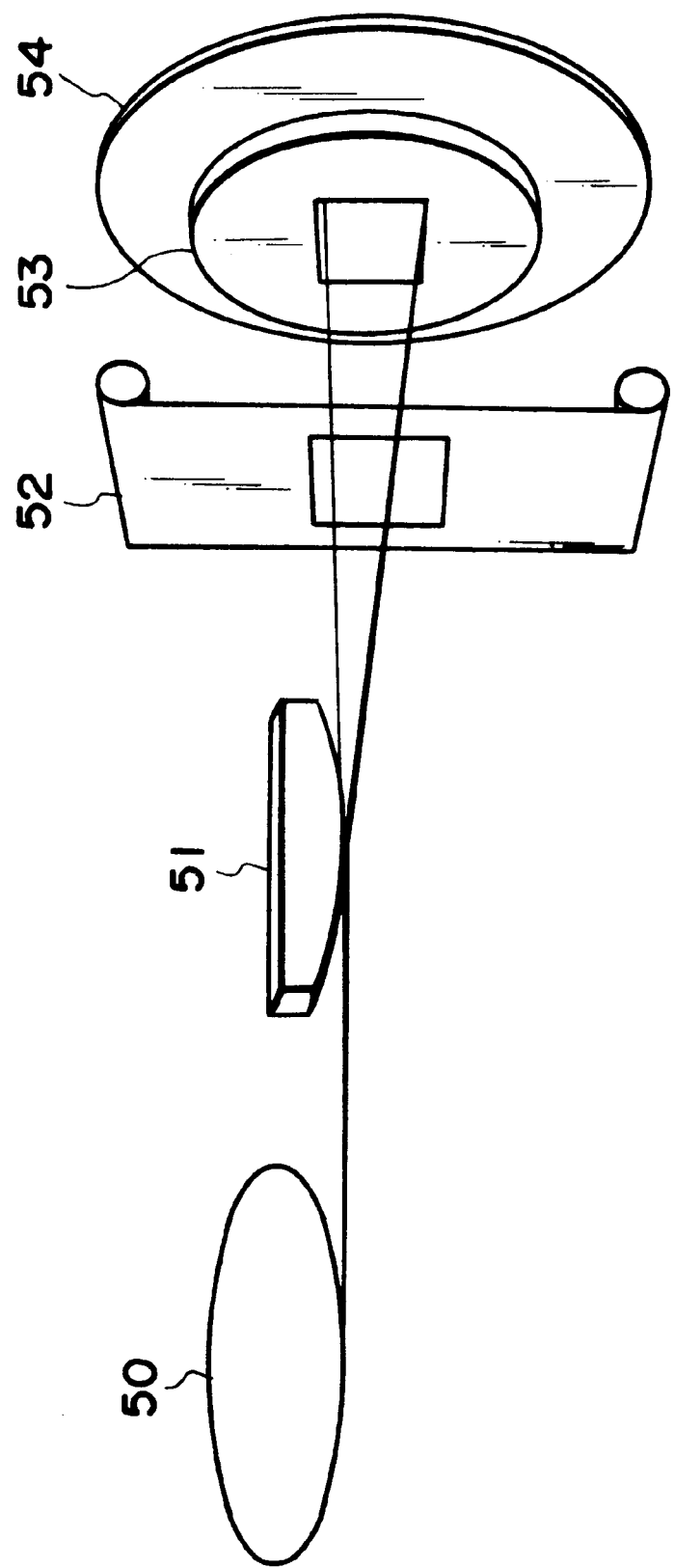
FIG. 26 is a schematic view of a general structure of an exposure apparatus.

FIG. 26 is a schematic view of a general structure of an exposure apparatus for the manufacture of semiconductor devices, having a mask holding mechanism such as described above. The illustrated example is an exposure apparatus which uses a synchrotron, as a light source. However, an electron beam radiation source may be used as a light source.

A synchrotron ring 50 produces a radiation beam of high luminance X-rays or vacuum ultraviolet rays. The beam is expanded by a total reflection mirror 51 and is directed thereby to the exposure apparatus. Shutter 52 performs exposure amount control. The radiation beam passing the shutter 52 is projected to a mask structure 53, by which a mask pattern is transferred to a wafer 54. The mask structure 53 may have a structure as having been described with reference to the preceding embodiments, and also the holding method therefor may be the same as has been described above.

[Embodiment 4: Device Manufacturing Method]

Figure 27:
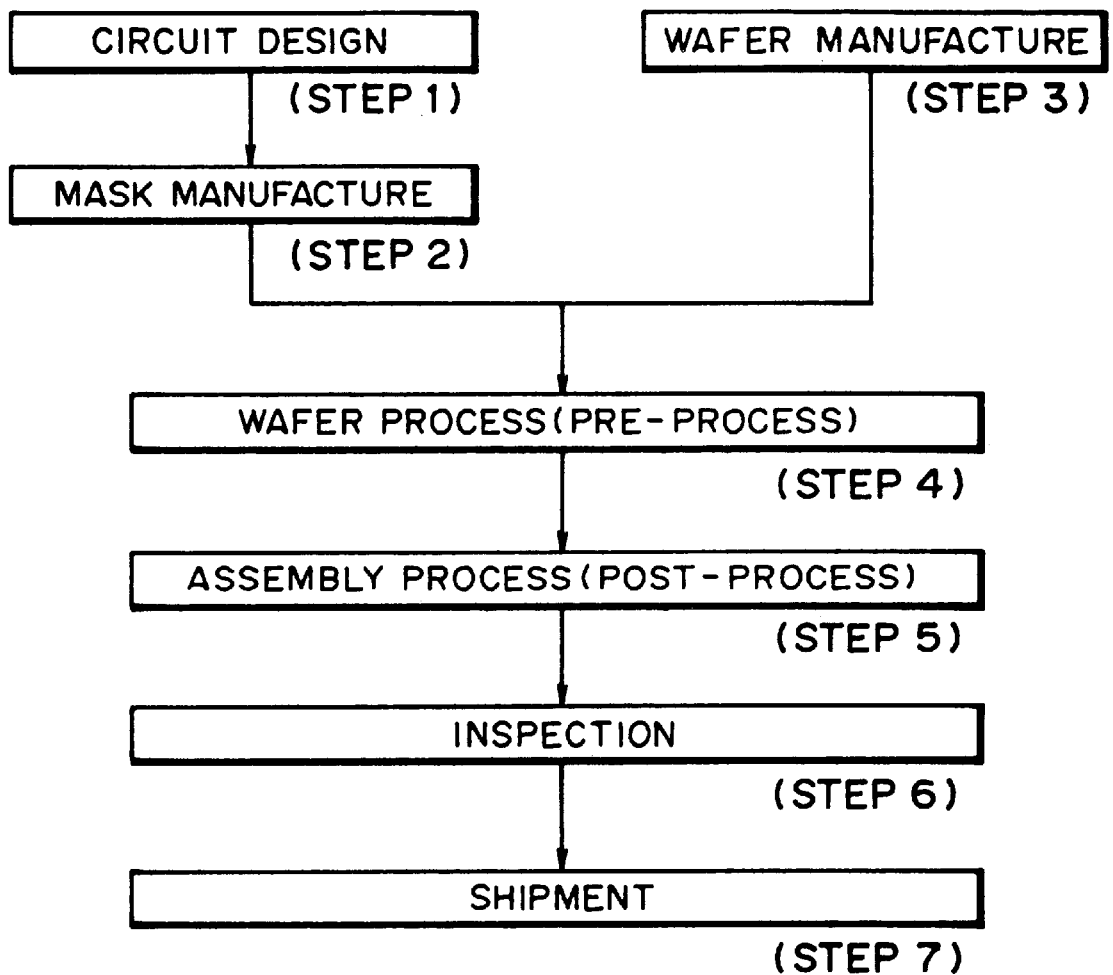
FIG. 27 is a flow chart of device manufacturing processes.

FIG. 27 is a flow chart of a procedure for the manufacture of semiconductor devices such as semiconductor chips (e.g., ICs or LSIs), liquid crystal panels, or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 28:
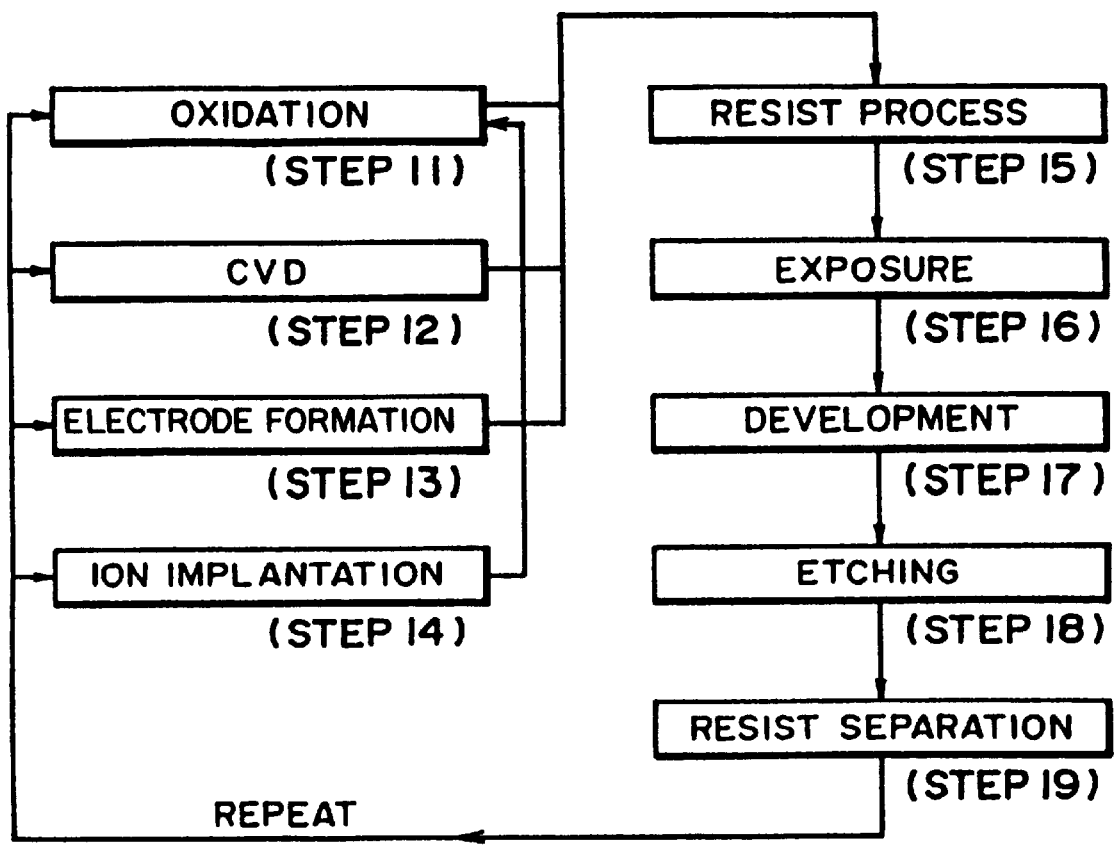
FIG. 28 is a flow chart for explaining details of a wafer process.

FIG. 28 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A mask holding system, comprising:

a chucking mechanism for holding a mask structure including a frame and a mask substrate having a rectangular window with a mask pattern; and a loading mechanism for applying, at a position along an extension of a diagonal of the rectangular window, a load to the frame in a direction along the plane of the mask, whereby the mask pattern can be distorted isotropically with the application of the load along the mask plane.

2. A system according to claim 1, wherein said loading mechanism includes two pressing mechanisms for pressing the frame in two diagonal directions, respectively.

3. A mask holding system comprising:

a chucking mechanism for holding a mask structure including a frame and a mask substrate having a rectangular window with a mask pattern, wherein the frame has a rigidity in a diagonal direction of the rectangular window, which rigidity is relatively larger than that in another direction; and a loading mechanism for applying a load to the frame in a direction along an extension of the diagonal of the rectangular window.

4. A system according to claim 1, wherein said chucking mechanism includes chucking means for chucking the frame at three locations and in a direction perpendicular to the pattern surface.

5. A system according to claim 4, wherein the three locations are disposed in a regular triangle shape, and when the mask structure is held by said chucking mechanism, one of the three locations is placed in a direction of an extension of a line from the center of the rectangular window and parallel to a side of the rectangular window.

6. An exposure apparatus including a mask holding system as recited in claim 1, for exposing a mask as held by said mask holding system.

7. A device manufacturing method, comprising the steps of:

providing a mask structure including a frame and a mask substrate having a rectangular window with a mask pattern;

providing a wafer;

correcting the mask pattern by applying, at a position along an extension of a diagonal of the rectangular window, a load to the frame in a direction along the plane of the mask, whereby the mask pattern can be distorted isotropically with the application of the load along the mask plane; and applying exposure energy to the mask structure and the wafer while holding the mask structure and the wafer in proximity to each other, to thereby transfer the mask pattern to the wafer.

8. A device manufacturing method, comprising the steps of:

providing a mask structure including a ring-like frame and a mask substrate having a rectangular window with a mask pattern, the ring-like frame having a rigidity in a direction of a diagonal of the rectangular window which is relatively larger than that in another direction;

providing a wafer;

correcting the mask pattern by applying a load to the frame; and applying exposure energy to the mask structure and the wafer while holding the mask structure and the wafer in proximity to each other, to thereby transfer the mask pattern to the wafer.

9. A method according to claim 7 or 8, wherein the exposure energy comprises a radiation beam of one of a beam of X-rays, a beam of vacuum ultraviolet rays and an electron beam.

10. A mask structure, comprising:

a mask substrate having a rectangular window with a mask pattern; and a ring-like frame for supporting the mask substrate, wherein said ring-like frame has a rigidity in a direction of a diagonal of the rectangular window, which rigidity is relatively larger than that in another direction.

11. A mask structure according to claim 10, wherein said mask structure is a lithographic mask for use with a radiation beam comprising one of a beam of X-rays, a beam of vacuum ultraviolet rays and an electron beam.

12. A mask holding system, comprising:

a chucking mechanism for holding a mask structure including (i) a mask substrate having a rectangular window with a mask pattern and (ii) a frame having a smaller-thickness portion with a level difference, in a peripheral portion thereof; and a loading mechanism for applying a load to the level difference portion of the frame in a direction along an extension of a diagonal of the rectangular window of the mask substrate, whereby the mask pattern can be distorted isotropically with the application of the load along a plane of the mask.

13. A system according to claim 12, wherein said loading mechanism includes two pressing mechanisms for pressing the frame in two diagonal directions, respectively.

14. A system according to claim 12, wherein said chucking mechanism includes chucking means for chucking the frame at three locations and in a direction perpendicular to the pattern surface.

15. A system according to claim 14, wherein the three locations are disposed in a regular triangle shape, and when the mask structure is held by said chucking mechanism, one of the three locations is placed in a direction of an extension of a line from the center of the rectangular window and parallel to a side of the rectangular window.

16. An exposure apparatus including a mask holding system as recited in claim 12, for exposing a mask as held by said mask holding system.

17. A device manufacturing method, comprising the steps of:

providing a mask structure including (i) a mask substrate having a rectangular window with a mask pattern and (ii) a frame having a smaller-thickness portion with a level difference, in a peripheral portion thereof;

providing a wafer;

correcting the mask pattern by applying a load to the level difference portion of the frame in a direction along an extension of a diagonal of the rectangular window of the mask substrate, whereby the mask pattern can be distorted isotropically with the application of the load along a plane of the mask; and applying exposure energy to the mask structure and the wafer while holding the mask structure and the wafer in proximity to each other, to thereby transfer the mask pattern to the wafer.

18. A method according to claim 17, wherein the exposure energy comprises a radiation beam of one of a beam of X-rays, a beam of vacuum ultraviolet rays and an electron beam.

19. A mask structure, comprising:

a mask substrate having a rectangular window with a mask pattern; and a frame for supporting the mask substrate, wherein said frame has a smaller-thickness portion in a peripheral portion thereof, being disposed in a direction of, or in a direction of an extension of, a diagonal of the rectangular window.

20. A mask structure according to claim 19, wherein said mask structure is a lithographic mask for use with a radiation beam comprising one of a beam of X-rays, a beam of vacuum ultraviolet rays and an electron beam.

* * * * *

UNITED STATES PATENT AND TRADEMARK OFFICE
CERTIFICATE OF CORRECTION

PATENT NO.   : 6,069,931
DATED        : May 30, 2000
INVENTOR(S)  : TAKESHI MIYACHI, ET AL.

It is certified that error appears in the above-identified patent and that said Letters Patent is hereby corrected as shown below:

```
COLUMN 4,
    Line 14, "to" should read --than--.
    Line 18, "ring-line" should read --ring-like--.

COLUMN 9,
    Line 11, "the" (third occurrence) should be deleted.
```

Signed and Sealed this

Fifteenth Day of May, 2001

*Attest:*

NICHOLAS P. GODICI

*Attesting Officer*   Acting Director of the United States Patent and Trademark Office